(12) United States Patent
Roth et al.

(10) Patent No.: US 11,671,010 B2
(45) Date of Patent: Jun. 6, 2023

(54) POWER DELIVERY FOR MULTI-CHIP-PACKAGE USING IN-PACKAGE VOLTAGE REGULATOR

(71) Applicant: Taiwan Semiconductor Manufacturing Co., Ltd., Hsin-Chu (TW)

(72) Inventors: Alan Roth, Leander, TX (US); Haohua Zhou, Fremont, CA (US); Eric Soenen, Austin, TX (US); Ying-Chih Hsu, Hsin-Chu (TW); Paul Ranucci, Leander, TX (US); Mei Hsu Wong, Saratoga, CA (US); Tze-Chiang Huang, Saratoga, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 195 days.

(21) Appl. No.: 16/991,335

(22) Filed: Aug. 12, 2020

(65) Prior Publication Data
US 2021/0249952 A1    Aug. 12, 2021

Related U.S. Application Data

(60) Provisional application No. 62/971,693, filed on Feb. 7, 2020.

(51) Int. Cl.
*H02M 3/156* (2006.01)
*H01L 23/498* (2006.01)
(Continued)

(52) U.S. Cl.
CPC ...... *H02M 3/156* (2013.01); *H01L 23/49589* (2013.01); *H01L 23/49811* (2013.01); *H01L 23/49838* (2013.01); *H01L 23/58* (2013.01)

(58) Field of Classification Search
CPC ............ H01L 23/42; H01L 23/49589; H01L 23/3675; H01L 23/49838; H01L 25/18;
(Continued)

(56) References Cited

U.S. PATENT DOCUMENTS 6,191,479 B1 *  2/2001  Herrell ............... H01L 23/5223
                                                 257/532
6,828,666 B1 * 12/2004  Herrell ................. H05K 1/0231
                                                 257/E23.079
(Continued)

FOREIGN PATENT DOCUMENTS

CN    103219327 A  *  7/2013  ......... H01L 25/0657
EP    3736856  A1  * 11/2020  ......... H01L 25/0652

OTHER PUBLICATIONS

Hou et al. "Integrated Deep Trench Capacitor in Si Interposer for CoWoS Heterogeneous Integration." 2019 IEEE International Electron Devices Meeting (IEDM), published on Feb. 13, 2020.
(Continued)

*Primary Examiner* — Alexander O Williams
(74) *Attorney, Agent, or Firm* — Eschweiler & Potashnik, LLC

(57) ABSTRACT

A semiconductor structure includes a first substrate. A first die and a second die are disposed over the first substrate and are adjacent to one another. A plurality of first conductive bumps are disposed between the first substrate and the first die and between the first substrate and the second die. A second substrate is disposed below the first substrate. A plurality of second conductive bumps is disposed between the first substrate and the second substrate. An in-package voltage regulator (PVR) chip is disposed over the second substrate. A molding material is disposed over the first substrate and surrounds the first die, the second die, the
(Continued)

plurality of first conductive bumps, the plurality of second conductive bumps, and the PVR chip.

20 Claims, 6 Drawing Sheets

(51) Int. Cl.
*H01L 23/58* (2006.01)
*H01L 23/495* (2006.01)

(58) Field of Classification Search
CPC ........... H01L 25/0655; H01L 23/49811; H01L 23/58; H01L 24/10; H01L 23/50; H01L 23/5383; H01L 23/5385; H01L 25/16; H01L 2224/73204; H01L 2924/181; H01L 2224/16225; H01L 2924/15311; H01L 23/49816; H01L 2224/32225; H01L 2924/00012; H01L 23/495; H01L 23/498; H01L 23/48911; H02M 3/003; H02M 3/156
USPC ......................................................... 257/499
See application file for complete search history.

(56) References Cited

U.S. PATENT DOCUMENTS

| | | | |
|---|---|---|---|
| 10,304,800 | B2 | 5/2019 | Chen et al. |
| 10,504,848 | B1* | 12/2019 | Parto ................... H01L 23/5383 |
| 2010/0165585 | A1* | 7/2010 | Lin ......................... H01L 24/05 |
| | | | 361/748 |
| 2014/0074449 | A1* | 3/2014 | Turner .................. G06F 30/367 |
| | | | 703/14 |
| 2014/0184189 | A1* | 7/2014 | Salem .................... H02M 3/158 |
| | | | 323/299 |
| 2017/0060151 | A1* | 3/2017 | Vaisband ................... G05F 1/46 |
| 2017/0263518 | A1* | 9/2017 | Yu ....................... H01L 23/5389 |
| 2018/0145051 | A1* | 5/2018 | Loo ......................... H01L 25/16 |
| 2019/0044442 | A1* | 2/2019 | Schaef ................. H02M 3/1588 |
| 2020/0006166 | A1* | 1/2020 | Raorane ................ H01L 23/645 |
| 2020/0006252 | A1* | 1/2020 | Yu ....................... H01L 25/0655 |
| 2020/0006505 | A1* | 1/2020 | Lu ..................... H01L 29/66553 |
| 2020/0098621 | A1* | 3/2020 | Bharath .............. H01L 25/0655 |
| 2020/0194393 | A1* | 6/2020 | Wu .......................... H01L 24/09 |
| 2020/0402934 | A1* | 12/2020 | Kim ................... H01L 23/49822 |
| 2020/0411448 | A1* | 12/2020 | Goh ................... H01L 23/49816 |
| 2021/0028145 | A1* | 1/2021 | Yu ......................... H01L 21/4853 |
| 2021/0202396 | A1* | 7/2021 | Wu ...................... H01L 23/3128 |
| 2021/0272889 | A1* | 9/2021 | Wu ................... H01L 23/49822 |

OTHER PUBLICATIONS

ASE Group. "Heterogeneous Integration." The date of publication is unknown. Retrieved online on Dec. 1, 2020 from https://ase.aseglobal.com/en/heterogeneous_integration.

Amkor Technology. "System in Package." Published Jul. 2019.

* cited by examiner

POWER DELIVERY FOR MULTI-CHIP-PACKAGE USING IN-PACKAGE VOLTAGE REGULATOR

REFERENCE TO RELATED APPLICATION

This application claims the benefit of U.S. Provisional Application No. 62/971,693, filed on Feb. 7, 2020, the contents of which are hereby incorporated by reference in their entirety.

BACKGROUND

Electronic equipment using semiconductor devices is essential for many modern applications. With the advancement of electronic technology, the semiconductor devices are becoming increasingly smaller in size while having greater functionality and greater amounts of integrated circuitry. Due to the miniaturized scale of the semiconductor device, a chip on wafer on substrate (COWOS) advanced packaging technology is widely used to integrate several chips into a single multi-chip package. In the COWOS advanced packaging technology, a number of chips are assembled into a single multi-chip package.

However, due to the large number of manufacturing steps and the small scale and/or dimensions of multi-chip packages, the manufacturing of the multi-chip packages becomes more complicated. An increase in a complexity of manufacturing the multi-chip packages may cause deficiencies such as poor structural configuration, delamination of components, or other issues, resulting in a high yield loss of the multi-chip packages and increased manufacturing cost. As such, there are many challenges for multi-chip packages and improving the manufacturing operations such multi-chip packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
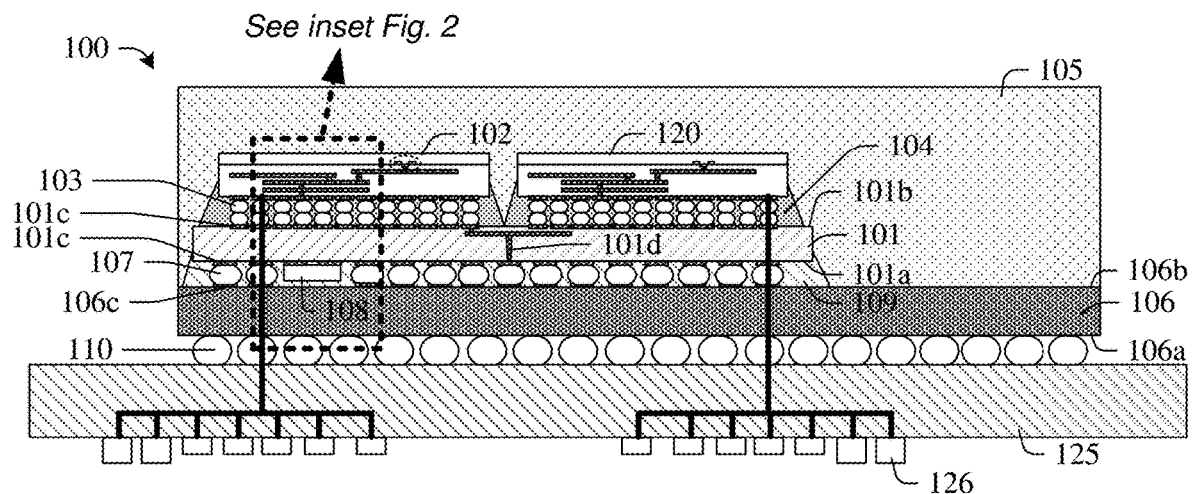
FIG. 1 illustrates a cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In this document, the term "coupled" may also be termed as "electrically coupled", and the term "connected" may be termed as "electrically connected". "Coupled" and "connected" may also be used to indicate that two or more elements cooperate or interact with each other.

The present disclosure provides several multi-chip package structures to improve power delivery to chips disposed within the multi-chip package structures. A semiconductor chip is manufactured by a number of operations. During the manufacturing process, the semiconductor chips with different functionalities and dimensions are integrated into a single module. Several semiconductor chips are disposed over a substrate by a surface mount technology (SMT) to integrate the semiconductor chips on the substrate. However, such SMT integration would result in a long electrical connection chips (for example, substantially greater than about 1 mm) between the semiconductor chips. Although the electrical connection between the semiconductor chips can be shortened by embedding the semiconductor chips into the substrate, such an embodiment would lower an overall capacitance or capacitance density.

In the present disclosure, several multi-chip package structures are disclosed. In particular, some disclosure solutions improve power delivery to chips within a multi-chip package structure, such as to high-performance computing (HPC) processors. In some embodiments, one or more dies are mounted on a first substrate, such as a silicon interposer. In one disclosed solution, Integrated Passive Device (IPD) capacitors are placed directly beneath the first substrate to provide more accessible and effective supply noise decoupling. In some embodiments, this can provide a 3.9% higher maximum clock frequency at a core voltage supply of 1.135 V than other approaches. In another disclosed solution, an in-Package Voltage Regulator (PVR) includes a buck converter with on-die inductors, and this PVR powers the one or more dies and provides excellent performance characteristics. As more chips are included in such multi-chip package structures, which in turn increases the power required, embedded PVRs with on-die inductors become more and more compelling to reduce losses. As such, some aspects of the present disclosure provide multi-chip package structures with improved electrical performance.

Figure 2:
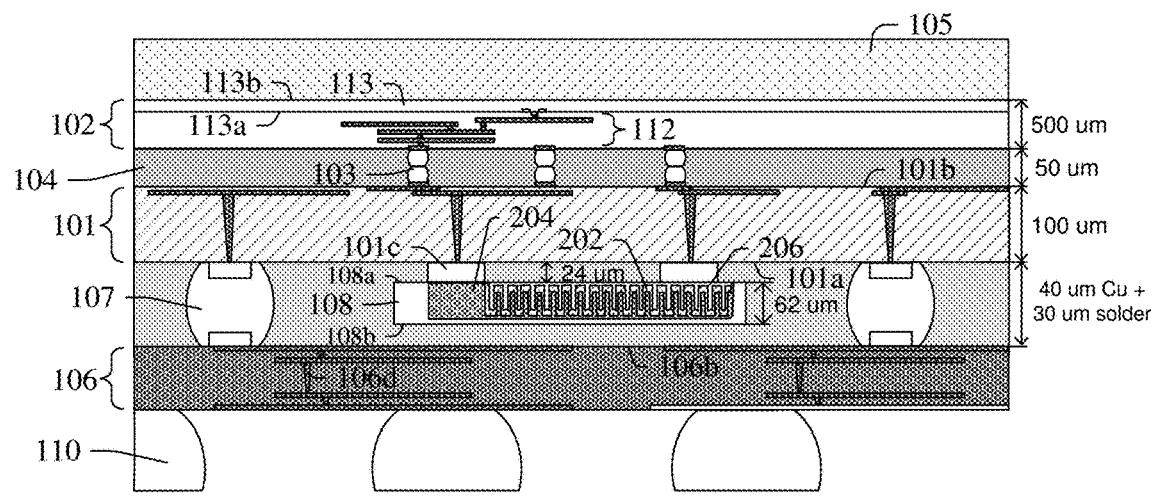
FIG. 2 illustrates a cross sectional view of an insert portion of the semiconductor structure in accordance with some embodiments of the present disclosure.

FIG. 1 is a cross sectional view of a semiconductor structure 100 in accordance with various embodiments of the present disclosure, and FIG. 2 is an inset view providing a more detailed view of some portions of the semiconductor structure 100 of FIG. 1. These figures are referred to concurrently in the following description. In some embodiments, the semiconductor structure 100 includes a first substrate 101, a first die 102, a plurality of first conductive bumps 103, a molding 105, a second substrate 106, a second conductive bump 107, a second die 108, and a third die 120. In some embodiments, the first die 102 and/or second die 108 and/or third die 120 includes a plurality of dies stacked over each other, and the stacked dies are electrically connected by several connectors.

In some embodiments, the semiconductor structure 100 is a semiconductor package. In some embodiments, the semiconductor structure 100 is a chip on wafer on substrate (COWOS) packaging structure. In some embodiments, the semiconductor structure 100 is a system on integrated chip (SoIC) packaging structure. In some embodiments, the semiconductor structure 100 is a three dimensional integrated circuit (3D IC).

In some embodiments, the first substrate 101 is a semiconductor substrate. In some embodiments, the first substrate 101 includes semiconductor material such as monocrystalline silicon, germanium, gallium, arsenic, or combinations thereof. In some embodiments, the first substrate 101 is an interposer or the like. In some embodiments, the first substrate 101 is a silicon substrate or silicon interposer. An interposer is an electrical interface routing between one chip, substrate, or other connection to another chip, substrate, or connection. The purpose of an interposer is to spread a connection to a wider pitch or to reroute a connection to a different connection. In some embodiments, the first substrate 101 includes organic material. In some embodiments, the first substrate 101 includes ceramic, polymer or the like. In other embodiments, the first substrate comprises a glass-reinforced epoxy laminate material, and can include woven fiberglass cloth with an epoxy resin binder; or can include an amide. In some embodiments, the first substrate 101 has a quadrilateral, rectangular, square, polygonal or any other suitable shape.

In some embodiments, the first substrate 101 includes a first surface 101a and a second surface 101b opposite to the first surface 101a. In some embodiments, a first conductive pad 101c is disposed at the first surface 101a or the second surface 101b. In some embodiments, the first conductive pad 101c is disposed within or on the first surface 101a or the second surface 101b. In some embodiments, the first conductive pad 101c is surrounded by the first substrate 101. In some embodiments, the first conductive pad 101c includes a conductive material such as chromium, copper, gold, titanium, silver, nickel, palladium, aluminum, or tungsten, etc. In some embodiments, the first conductive pad 101c is a solderable surface and serves as a platform for receiving a conductive structure.

In some embodiments, the first substrate 101 can manifest as an interposer, which is an electrical interface routing between the second substrate 106 and the first die 102 and/or second die 120 for connection to one another. The purpose of such an interposer is to spread a connection to a wider pitch or to reroute a connection to a different connection. In some such embodiments, a first via 101d is disposed within the first substrate 101. In some embodiments, first via 101d extends through the first substrate 101. In some embodiments, the first via 101d is extended between the first surface 101a and the second surface 101b of the first substrate 101. In some embodiments, the first via 101d includes a conductive material such as copper, silver, gold, aluminum, tungsten, etc. In some embodiments, the first via 101d is a through substrate via (TSV) or a through silicon via. In some embodiments, the first via 101d is electrically connected with the first conductive pad 101c. In some embodiments, the first via 101d is disposed between two of the first conductive pads 101c. Additional conductive lines running horizontally through the first substrate 101, and/or additional vias extending vertically through the first substrate 101 can also be present.

In some embodiments, the first die 102 is disposed over the first substrate 101. In some embodiments, the first die 102 is disposed over the second surface 101b of the first substrate 101. In some embodiments, the first die 102 is fabricated with a predetermined functional circuit within the first die 102. In some embodiments, the first die 102 is singulated from a semiconductor wafer by a mechanical blade or a laser blade. In some embodiments, the first die 102 comprises a variety of electrical circuits suitable for a particular application. In some embodiments, the electrical circuits include various devices such as transistors, capacitors, resistors, diodes and/or the like. In some embodiments, the first die 102 is a logic device die, application-specific integrated circuit (ASIC) die, application processing (AP) die, memory die, high bandwidth memory (HBM) die or the like. In some embodiments, the first die 102 is a chip or a package. In some embodiments, the first die 102 has a top cross section (a cross section from the top view of the semiconductor structure 100 as shown in FIG. 1) in a quadrilateral, a rectangular or a square shape. In some embodiments, the first die is a CMOS chiplet that includes four ARM® Cortex®-A72 cores.

In some embodiments, the first die 102 includes a silicon substrate 113 and an interconnect structure 112 (see FIG. 2). The silicon substrate 113 includes a third surface 113a and a fourth surface 113b opposite to the third surface 113a. In some embodiments, the third surface 113a is a front side or an active side that several electrical components are disposed thereon. In some embodiments, the fourth surface 113b is a back side or an inactive side where electrical components are absent there from. In some embodiments, the third surface 113a faces to the first substrate 101. In some embodiments, the third die 120 can have features that are analogous to the first die 102, including a silicon substrate and an interconnect structure.

In some embodiments, the first die 102 is bonded over the first substrate 101 by several first conductive bumps 103. In some embodiments, the first conductive bump 103 is disposed between the first substrate 101 and the first die 102. In some embodiments, the first conductive bump 103 is disposed between the second surface 101b of the first substrate 101 and the third surface 113a of the first die 102. In some embodiments, the first die 102 is electrically connected to the first substrate 101 through the first conductive bump 103. In some embodiments, the first conductive bump 103 is disposed between the second surface 101b of the first substrate 101 and the third die 120, and the third die 120 is electrically connected to the first substrate 101 through the first conductive bump 103. In some embodiments, the first conductive bump 103 is electrically connected to the first via 101d through the first conductive pad 101c.

In some embodiments, the first conductive bump 103 is in a cylindrical, spherical or hemispherical shape. In some embodiments, the first conductive bump 103 is a solder joint, a solder bump, a solder ball, microbump or the like. In some embodiments, the first conductive bump 103 is a conductive pillar or post. In some embodiments, the first conductive bump 103 includes metals such as lead, tin, copper, gold, nickel, etc. In some embodiments, the first conductive bump is a microbump with a height ranging from approximately 30 micrometers to approximately 80 micrometers, and the height of the microbump being 50 micrometers plus or minus 2 micrometers in some embodiments.

In some embodiments, a first underfill material 104 is disposed over the first substrate 101 and surrounds the first conductive bump 103 and the first die 102. In some embodiments, a first underfill material 104 is disposed over the first substrate 101 and surrounds the first conductive bump 103, the first die 102 and the third die 120. In some embodiments, the first underfill material 104 is disposed over the second surface 101b of the first substrate 101. In some embodiments, the first underfill material 104 encapsulates the first conductive bump 103. In some embodiments, the first underfill material 104 is in contact with the second surface 101b of the first substrate 101, the third surface 113a of the first die 102 and a portion of a sidewall of the first die 102. In some embodiments, the first underfill material 104 fills spacing between two adjacent first conductive bumps 103. In some embodiments, the first underfill material 104 is an electrically insulated adhesive for protecting the first conductive bump 103 or securing a bonding between the first die 102 and the first substrate 101, and a bonding between the third die 111 and the first substrate 101. In some embodiments, the first underfill material 104 includes epoxy, resin, molding compounds, etc. The first underfill material 104 can include a single homogenous composition in some embodiments, while in other embodiments can include multiple regions or layers with different material compositions.

In some embodiments, the molding 105 is disposed over the first substrate 101 and surrounds the first die and the third die 120. In some embodiments, the molding 105 is disposed over the second surface 101b of the first substrate 101 and surrounds the first die 102, the third die 120, the first underfill material 104, and the first conductive bump 103. In some embodiments, the molding 105 is in contact with a sidewall of the first die 102, the first underfill material 104, and the second surface 101b of the first substrate 101. In some embodiments, the fourth surface 113b of the first die 102 is in contact with the molding 105. In some embodiments, the molding 105 can be a single layer film or a composite stack. In some embodiments, the molding 105 includes various materials, such as molding compound, molding underfill, epoxy, resin, or the like. In some embodiments, the molding 105 has a high thermal conductivity, a low moisture absorption rate, and a high flexural strength.

In some embodiments, the second substrate 106 is a semiconductor substrate. In some embodiments, the second substrate 106 includes semiconductor material such as silicon, germanium, gallium, arsenic, or combinations thereof. In some embodiments, the second substrate 106 is a silicon substrate. In some embodiments, the second substrate 106 includes organic material. In some embodiments, the second substrate 106 includes resin, epoxy, glass, ceramic, polymer or the like. In some embodiments, the second substrate 106 has a quadrilateral, rectangular, square, polygonal or any other suitable shape.

In some embodiments, the second substrate 106 includes a fifth surface 106a and a sixth surface 106b opposite to the fifth surface 106a. In some embodiments, the second substrate 106 is disposed below the first substrate 101, the first die 102 and the molding 105. In some embodiments, the second substrate 106 is disposed below the first surface 101a of the first substrate 101. In some embodiments, the sixth surface 106b of the second substrate 106 faces to the first surface 101a of the first substrate 101.

In some embodiments, a second conductive pad 106c is disposed at the fifth surface 106a or the sixth surface 106b. In some embodiments, the second conductive pad 106c is disposed within or on the fifth surface 106a or the sixth surface 106b. In some embodiments, the second conductive pad 106c is surrounded by the second substrate 106. In some embodiments, the second conductive pad 106c includes a conductive material such as chromium, copper, gold, titanium, silver, nickel, palladium, tungsten, etc. In some embodiments, the second conductive pad 106c is a solderable surface and serves as a platform for receiving a conductive structure.

In some embodiments, a second via 106d is disposed within the second substrate 106. In some embodiments, second via 106d extends through the second substrate 106. In some embodiments, the second via 106d is extended between the fifth surface 106a and the sixth surface 106b of the second substrate 106. In some embodiments, the second via 106d includes a conductive material such as copper, silver, gold, aluminum, etc. In some embodiments, the second via 106d is a plated through hole (PTH). In some embodiments, the second via 106d is electrically connected with the second conductive pad 106c. In some embodiments, the second via 106d is disposed between two of the second conductive pads 106c.

In some embodiments, the first substrate 101 is bonded over the second substrate 106 by several second conductive bumps 107. In some embodiments, the second conductive bump 107 is disposed between the first substrate 101 and the second substrate 106. In some embodiments, the second conductive bump 107 is disposed between the first surface 101a of the first substrate 101 and the sixth surface 106b of the second substrate 106. In some embodiments, the first substrate 101 is electrically connected to the second substrate 106 through the second conductive bump 107. In some embodiments, the second conductive pad 106c and the second via 106d are electrically connected to the second conductive bump 107. In some embodiments, the second conductive bump 107 is electrically coupled with the first conductive pad 101c and the second conductive pad 106c.

In some embodiments, the second conductive bump 107 is in a cylindrical, spherical or hemispherical shape. In some embodiments, the second conductive bump 107 is a solder joint, a solder bump, a solder ball, a ball grid array (BGA) ball, a controlled collapse chip connection (C4) bump, microbump, or the like. In some embodiments, the second conductive bump 107 is a conductive pillar or post. In some embodiments, the second conductive bump 107 includes metals such as lead, tin, copper, gold, nickel, etc. In some embodiments, the second conductive bump 107 has a height that is less than a height of the first conductive bump 103.

In some embodiments, the second die 108 is disposed below the first substrate 101 and above the second substrate 106. In some embodiments, the second die 108 is disposed between the first substrate 101 and the second substrate 106. In some embodiments, the second die 108 is laterally surrounded by the second conductive bumps 107. In some embodiments, the second die 108 is disposed between the first die 102 and the second substrate 106. In some embodiments, the second die 108 is disposed between the molding 105 and the second substrate 106.

In some embodiments, the second die 108 is fabricated with a predetermined functional circuit within the second die 108. In some embodiments, the second die 108 is singulated from a semiconductor wafer by a mechanical blade or a laser blade. In some embodiments, the second die 108 comprises a variety of electrical circuits suitable for a particular application, wherein the electrical circuits include various devices such as transistors, capacitors, resistors, diodes and/or the like. In some embodiments, the first die and/or second die is powered by a laterally mounted in-Package Voltage Regulator (PVR) buck converter instantiated within the second die 108. The PVR buck converter includes high-permeability on-die inductors. As the number of CPU cores increase, which in turn increases the power required, embedded PVRs with on-die inductors are more compelling to reduce losses. In other embodiments, the PVR buck converter can also be arranged on the second substrate and spaced laterally apart from the first die 102 and/or second die 120 (see e.g., FIGS. 3-5 discussed further herein). In some embodiments, the second die 108 is an integrated passive die (IPD). In some embodiments, the second die 108 includes a capacitor, a passive device or the like. In some embodiments, the second die 108 is a chip or a package. In some embodiments, the second die 108 has a top cross section (a cross section from the top view of the semiconductor structure 100 as shown in FIGS. 1 and 2) in a quadrilateral, a rectangular or a square shape. In some embodiments, the second die 108 includes IPD capacitors and is placed directly beneath the first substrate 101 to provide more accessible and effective supply noise decoupling. In some embodiments, the IPD capacitors are realized as high-density trench capacitors built in 180 nm CMOS, wherein each IPD capacitor offers 97 nF of additional capacitance, with a 1 MHz equivalent series resistance (ESR) of 47 mΩ and equivalent series inductance (ESL) of 0.51 pH. In some cases, this can result in 3.9% higher maximum clock frequency at a core supply of 1.135 V.

In some embodiments, the second die 108 includes a seventh surface 108a and an eighth surface 108b opposite to the seventh surface 108a. In some embodiments, the seventh surface 108a is a front side or an active side that several electrical components are disposed thereon. In some embodiments, the eighth surface 108b is a back side or an inactive side that electrical component disposed thereon is absent. In some embodiments, the seventh surface 108a faces to the first surface 101a of the first substrate 101. In some embodiments, the eighth surface 108b faces to the sixth surface 106b of the second substrate 106.

In some embodiments, the second die 108 is bonded below the first substrate 101 by the second conductive bumps 107. In some embodiments, the second conductive bump 107 is disposed between the first substrate 101 and the second die 108. In some embodiments, the second die 108 is attached to the first surface 101a of the first substrate 101 by the second conductive bump 107. In some embodiments, the second conductive bump 107 is disposed between the first surface 101a of the first substrate 101 and the seventh surface 108a of the second die 108. In some embodiments, the second die 108 is electrically connected to the first substrate 101 and the first die 102 through the second conductive bump 107. In some embodiments, the second die 108 is electrically connected to the first die 102 through the second conductive bump 107, the first conducive pad 101c, the first via 101d and the first conductive bump 103.

In some embodiments, the second die includes a trench capacitor disposed in a semiconductor substrate of the second die, wherein the trench capacitor is configured as a decoupling capacitor for the first die 102 and or third die 120. As shown in FIG. 2, the trench capacitor includes a trench disposed in an upper surface of the semiconductor substrate, and a capacitor dielectric layer 202 that lines inner sidewalls of the trench and that lines a bottom surface of the trench. A first capacitor plate 204, such as doped region or another conductive region is disposed in the semiconductor substrate, and a conductive body 206 is disposed over the trench to establish a second capacitor plate. The conductive body 206 can comprise a metal, such as copper, silver, gold, aluminum, tungsten, etc., and/or can comprise doped polysilicon. In the illustrated embodiment, the conductive body 206 extends over an uppermost surface of the capacitor dielectric layer 202, thereby establishing an upper bridge portion that connects more vertical finger-like projection in the trench; but in other embodiments, the conductive body 206 does not include upper bridge portions and the trench capacitor includes solely the vertical finger-like projections which snake through the trench such that an uppermost surface of the conductive body 206 is planarized and/or level with the uppermost surface of the capacitor dielectric layer 202. A first conducive pad 101c connects the conductive body of the trench capacitor to the first die and/or second die through the via 101d; and another first conductive pad 101c connects the first capacitor plate 204 of the trench capacitor to the first die and/or second die through the via 101d.

In some embodiments, a second underfill material 109 is disposed over the second substrate 106 and surrounds the second conductive bump 107 and the second die 108. In some embodiments, the second underfill material 109 is disposed between the first substrate 101 and the second substrate 106. In some embodiments, a portion of the first substrate 101 is surrounded by the second underfill material 109. In some embodiments, the second underfill material 109 is disposed over the sixth surface 106b of the second substrate 106. In some embodiments, the second underfill material 109 is disposed between the first surface 101a of the first substrate 101 and the sixth surface 106b of the second substrate 106. In some embodiments, the second underfill material 109 encapsulates the second conductive bump 107. In some embodiments, the second die 108 is entirely encapsulated by the second underfill material 109. In some embodiments, at least a portion of the second underfill material 109 is disposed between the second die 108 and the second substrate 106. In some embodiments, the seventh surface 108a, the eighth surface 108b and a sidewall of the second die 108 are in contact with the second underfill material 109. In some embodiments, at least one of the second conductive bumps 107 is disposed between the second die 108 and a sidewall of the second underfill material 109. In some embodiments, the second underfill material 109 fills spacing between two adjacent second conductive bumps 107. In some embodiments, the second underfill material 109 is an electrically insulated adhesive for protecting the second conductive bump 107 or securing a bonding between the first substrate 101 and the second substrate 106 or between the first substrate 101 and the second die 108. In some embodiments, the second underfill material 109 includes epoxy, resin, epoxy molding compounds or etc. The second underfill material 109 can include a single homogenous composition in some embodiments, while in other embodiments can include multiple regions or layers with different material compositions.

In some embodiments, several third conductive bumps 110 are disposed below the second substrate 106. In some embodiments, the third conductive bump 110 is disposed at the fifth surface 106a of the second substrate 106. In some embodiments, the third conductive bump 110 is disposed at the second conductive pad 106c. In some embodiments, the third conductive bump 110 is electrically connected to the second via 106d. In some embodiments, the third conductive bump 110 is in a cylindrical, spherical or hemispherical shape. In some embodiments, the third conductive bump 110 is a solder joint, a solder bump, a solder ball, a ball grid array (BGA) ball, a controlled collapse chip connection (C4) bump, microbump or the like. In some embodiments, the third conductive bump 110 is a conductive pillar or post. In some embodiments, the third conductive bump 110 includes metals such as lead, tin, copper, gold, nickel, etc.

The third conductive bumps 110 electrically couple the second substrate 106 to conductive pads and/or conductive traces on a printed circuit board 125. The printed circuit board 125 is configured to receive components, such as integrated chips, heat sinks, and/or discrete devices such as capacitors, resistors, inductors, and the like; and includes conductive features contained within a mechanical structure to couple the components to one another. The conductive features include copper traces, pads, or conductive planes; and the mechanical structure is made with insulating material laminated between layers of conductive material. Additional IPD capacitors 126 may in some embodiments be disposed on a lower surface of the printed circuit board 125 and operably coupled to the first die, second die, and/or third die.

Figure 3:
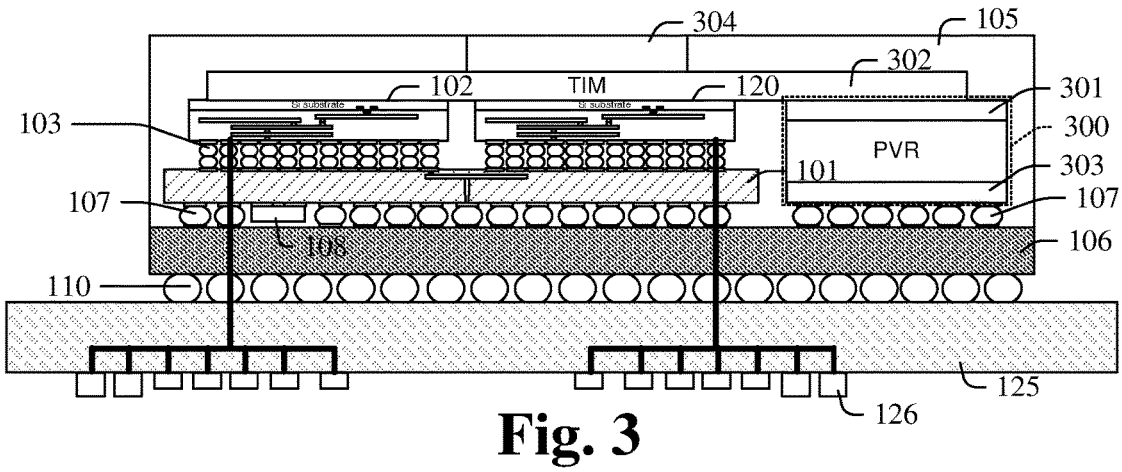
FIG. 3 illustrates a cross sectional view of a semiconductor structure in accordance with some embodiments of the present disclosure.

FIG. 3 is a schematic cross sectional view of a semiconductor structure in accordance with various embodiments of the present disclosure. In some embodiments, the semiconductor structure includes a first substrate 101, a first die 102, a plurality of first conductive bumps 103, a molding 105, a second substrate 106, a second conductive bump 107, and a third conductive bump 110, which have similar configurations as those described above or illustrated in FIG. 1 and/or FIG. 2. Though not explicitly illustrated in FIG. 3, the first underfill material 104 and/or second underfill material 109 of FIG. 1 can also be present in other examples of FIG. 3.

FIG. 3 illustrates an embodiment where an in-Package Voltage Regulator (PVR) chip 300 is integrated in the package and juxtaposed to the first substrate 101. In some embodiments, the PVR chip 300 includes a silicon substrate 301 and an interconnect structure, wherein the interconnect structure includes on-die inductors 303 that are solenoids built using the two uppermost metal layers in the interconnect and interposing via levels wrapped around a high-permeability CoZrTa magnetic core. By using these inductors 303, the PVR chip 300 provides an eight-phase buck converter regulating from a 1.8V input at a 120 MHz switching frequency and 10 MHz closed-loop bandwidth. The PVR chip 300 includes one or more on-die inductors, each sized at 3.9 nH, that. To minimize parasitic inductive coupling loss, the footprint of the second substrate 106 and any die directly above or directly below the on-die inductors 303 were devoid of any active (non-dummy) circuitry or metallization.

In some embodiments, a thermal interface material (TIM) layer 302 is disposed over top surfaces of the first die 102, the second die 108, and the PVR chip 300. The TIM layer 302 can be disposed within the molding layer 105. In some embodiments, the uppermost surfaces of the first die 102, second die 108, and PVR chip 300 are flat or planar with one another. Because vertical spans of the TIM layer 302 may tend to lead to localized heating in any such vertical spans, the TIM layer 302 is correspondingly flat or planar and comprises solely horizontal spans in some cases to promote uniform temperatures throughout the semiconductor structure. In some embodiments, TIM layer 302 comprises a thermally conductive and electrically insulative material, such as an epoxy, like an epoxy mixed with a metal such as silver or gold, a "thermal grease," a "white grease," other suitable material, or a combination thereof. In some embodiments, a thermal management device 304 such as a heat sink is placed on the TIM layer 302 to facilitate the dissipation of heat within the semiconductor structure. In some embodiments, the TIM layer 302 has a thermal conductivity that is high enough to provide sufficient passive cooling for the integrated circuit package. For instance, in some embodiments of the present disclosure, the TIM layer 302 has a thermal conductivity between about 3 W/m-K and about 10 W/m-K. In some embodiments, depending on the specific materials used in the TIM layer 302, the thermal conductivity of the TIM layer 302 is higher than 10 W/m-K.

Figure 4:
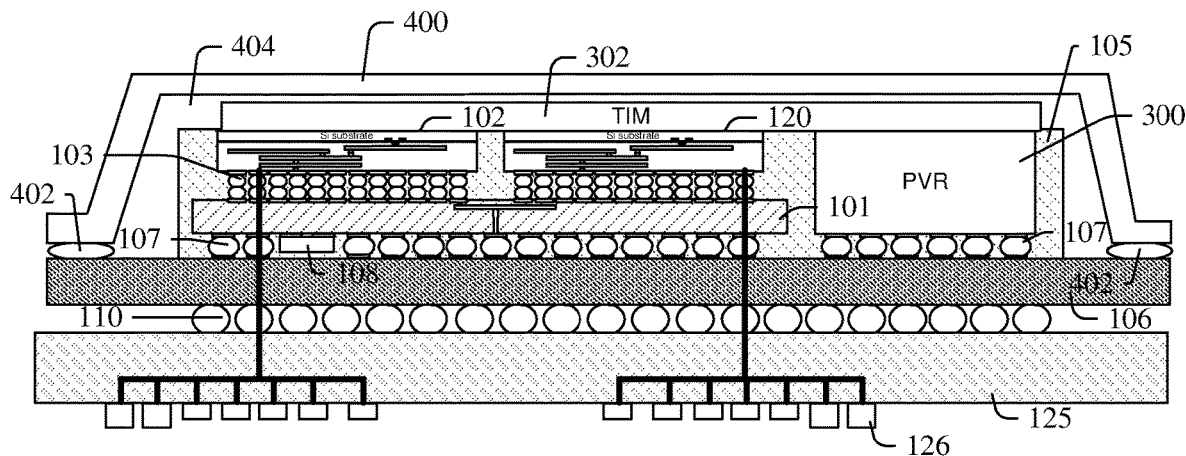
FIG. 4 illustrates a cross sectional view of a semiconductor structure in accordance with some embodiments of the present disclosure.

FIG. 4 is a schematic cross sectional view of another semiconductor structure in accordance with various embodiments of the present disclosure. In some embodiments, the semiconductor structure includes a first substrate 101, a first die 102, a plurality of first conductive bumps 103, a molding 105, a second substrate 106, a second conductive bump 107, and a third conductive bump 110, which have similar configurations as those described above or illustrated in FIG. 1 and/or FIG. 2. Though not explicitly illustrated in FIG. 4, the first underfill material 104 and/or second underfill material 109 of FIG. 1 can also be present in other examples of FIG. 4.

FIG. 4 again includes a PVR chip 300 and a TIM layer 302. In this embodiment, a cap structure 400, which can be made of a metal for example, encloses the multi-chip package. In some embodiments, the cap structure 400 can comprise aluminum, copper, tin, or another metal, but in alternative embodiments the cap structure 400 can comprise plastic or other suitable material. The cap structure 400 includes edge portions that are bonded to the second substrate 106, and a central portion that is raised up over the second substrate 106 to define a gas-filled cavity 404, such as an air-filled, vacuum-filled, or inert-gas filled cavity for example, that encloses the first substrate 101, the first die 102, the second die 108, and the PVR chip 300. An adhesive or bonding material 402 adheres a bottom surface of the cap structure 400 to an upper surface of the second substrate 106, such that the cap structure 400 provides environmental protection for the first substrate 101, first die 102, and other features covered by the cap structure 400.

Figure 5:
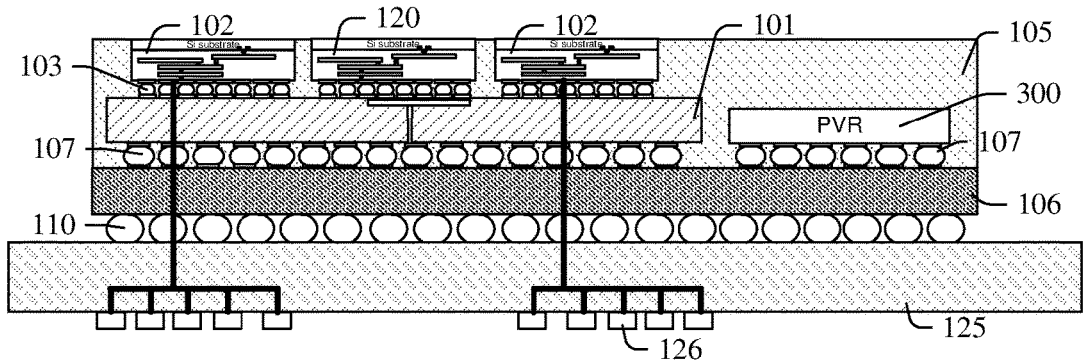
FIG. 5 illustrates a cross sectional view of a semiconductor structure in accordance with some embodiments of the present disclosure.

FIG. 5 is a schematic cross sectional view of a semiconductor structure in accordance with various embodiments of the present disclosure. In some embodiments, the semiconductor structure of FIG. 5 includes a first substrate 101, a first die 102, a first conductive bump 103, a molding 105, a second substrate 106, a second conductive bump 107, and a third conductive bump 110, which have similar configurations as those described above or illustrated in FIG. 1 and/or FIG. 2. Though not explicitly illustrated in FIG. 5, the first underfill material 104 and/or second underfill material 109 of FIG. 1 can also be present in other examples of FIG. 5.

In FIG. 5, an uppermost surface of the first substrate 101 is planar or level with an uppermost surface of the PVR chip 300. The first die 102 and third die 120 are high bandwidth memory (HBM) die, and the second die 108 is a central processing unit that communicates with the HBM die 102, 120 through the first substrate 101. Thus, the first substrate 101 may act as an interposer substrate that allows for physical connections and electrical connections of chips to one another, but which has no active devices thereon.

Figure 6:
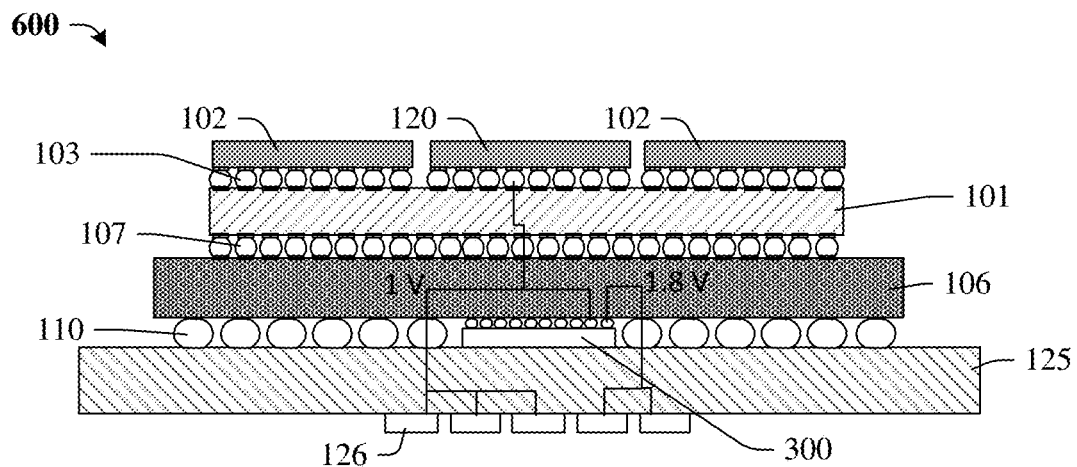
FIG. 6 illustrates a cross sectional view of a semiconductor structure in accordance with some embodiments of the present disclosure.

In FIG. 6, the PVR chip 300 is positioned under the lower surface of the second substrate and between sidewalls of neighboring third conductive bumps 110. The upper surface of the PVR chip 300 may be connected to conductive pads on the lower surface of the second substrate. In this example, the PVR chip 300 is relatively close to the decoupling capacitors 126, which are located on the underside of the printed circuit board 125, thereby promoting better performance for the system.

Figure 7:
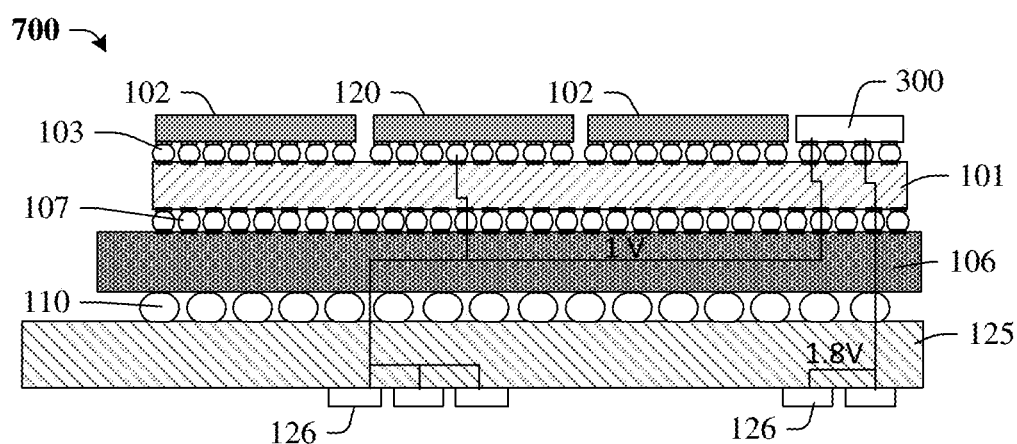
FIG. 7 illustrates a cross sectional view of a semiconductor structure in accordance with some embodiments of the present disclosure.

In FIG. 7, the PVR chip 300 is positioned on the upper surface of the first substrate 101 and connected to the first die 102 through first conductive bumps 103, the first substrate 101, solder bumps 107, and the second substrate 106. In this embodiment, the uppermost surfaces of the first die 102, second die 130, and PVR chip 300 are flat or planar with one another.

Figure 8:
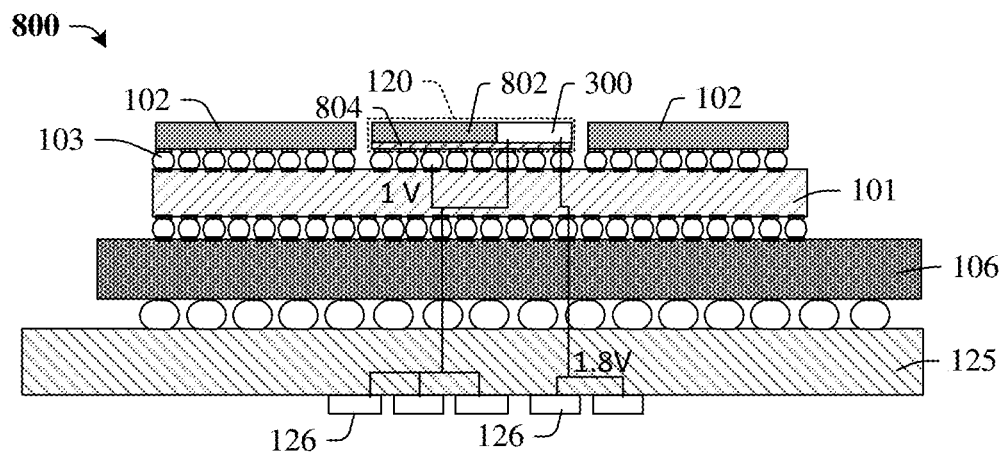
FIG. 8 illustrates a cross sectional view of a semiconductor structure in accordance with some embodiments of the present disclosure.

In FIG. 8, the PVR chip 300 is integrated on a single silicon substrate with a central processing unit 802, and the inductor 804 of the PVR chip 300 is also located on the single silicon substrate. In this example, the PVR chip 300 is coupled to the decoupling capacitors 126, which are located on the underside of the printed circuit board 125, though the first substrate 101 and second substrate 106, thereby promoting good performance for the system.

Figure 9:
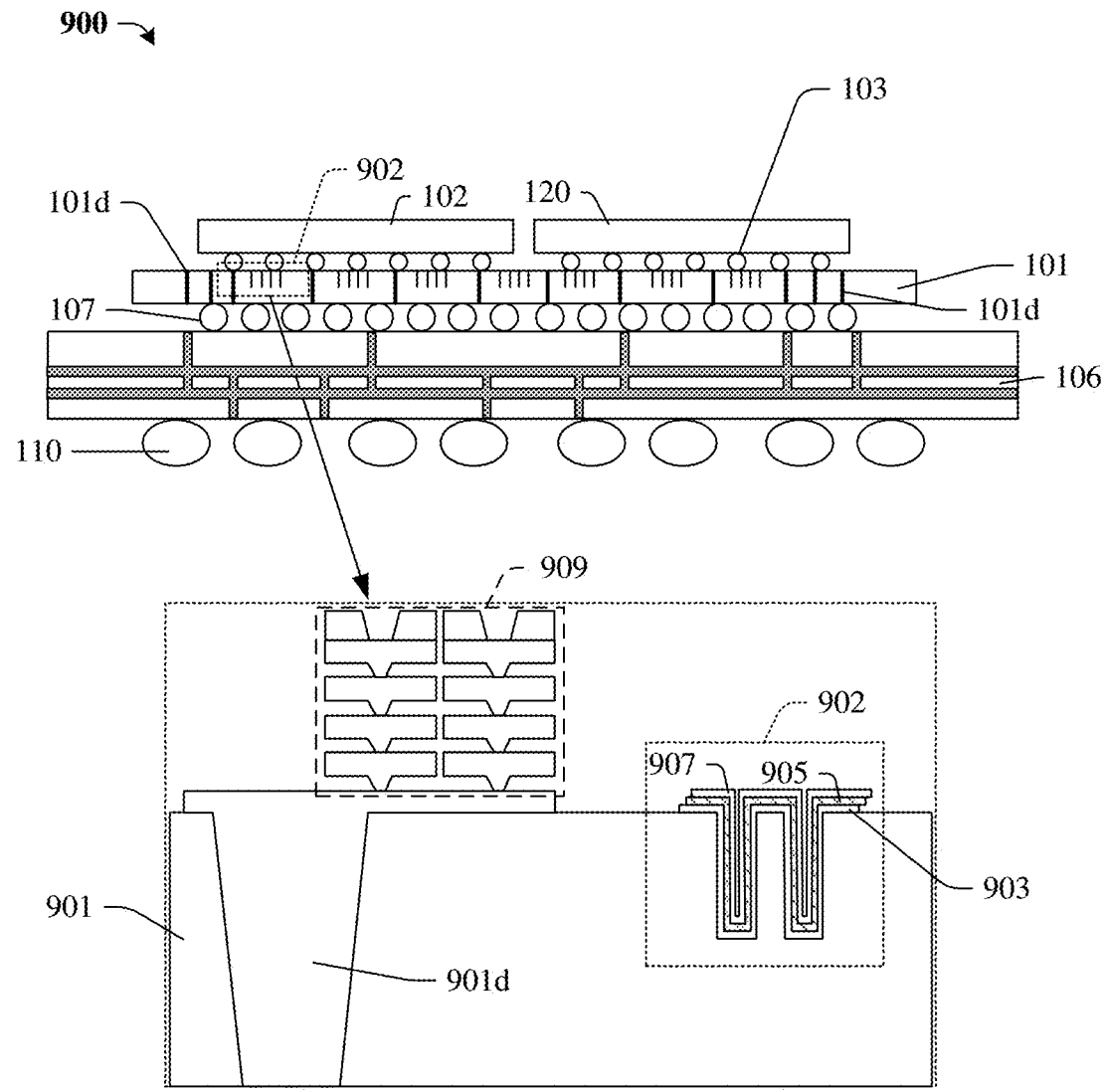
FIG. 9 illustrates a cross sectional view of a semiconductor structure in accordance with some embodiments of the present disclosure, and an inset view of some portions of the semiconductor structure.

FIG. 9 illustrates an embodiment where a decoupling capacitor 902 is disposed on an upper surface of the first substrate 101. Thus, in the example of FIG. 9, the first substrate 101 is an interposer substrate that provides connections between a first die 102 and/or second die 120 and the second substrate 106. The first substrate 101 can include through substrate vias (TSVs) 101d and horizontal metal layers to enable fan out connection from the first die 102 and/or second die 120, such that connections on the first die 102 (or second die 120) correspond to more widely spaced connections for the second substrate 106. Further, in FIG. 9's embodiment, the first substrate 101 includes one or more integrated passive capacitors 902 integrated directly into an upper surface of the first substrate 101. As shown in the lower portion of FIG. 9, the first substrate 101 can include a silicon interposer substrate 901 with a TSV 901d passing from a second surface of the silicon interposer substrate 101 to the first surface of the silicon interposer substrate 101. Trenches are disposed in the second surface and are spaced apart from the first via 901d. The trenches are filled with a first conductive layer 903, an insulating layer 905, and a second conductive layer 907 to establish a decoupling capacitor within the silicon interposer substrate. A bond pad 909, which is made up of a series of metal features and vias that are stacked over one another to better tolerate stresses during bonding, are coupled to the TSV 901d. The decoupling capacitor 902 can be coupled to such a bond pad directly, or can be coupled to the bond pad indirectly through horizontal conductive features (e.g., metal wires) and/or vertical conductive features (e.g., vias) in the silicon interposer substrate. Interposer substrates are already considered to be an expensive packaging component, and integrating the decoupling capacitor 902 directly into the body of the silicon interposer substrate can add additional cost to interposer substrate. However, this integration of the decoupling capacitor can put the decoupling capacitor 902 closer to the first die 102 and/or second die 120, and thus, can improve system performance for the overall package, and thus is a meaningful improvement in many regards.

Figure 10A:
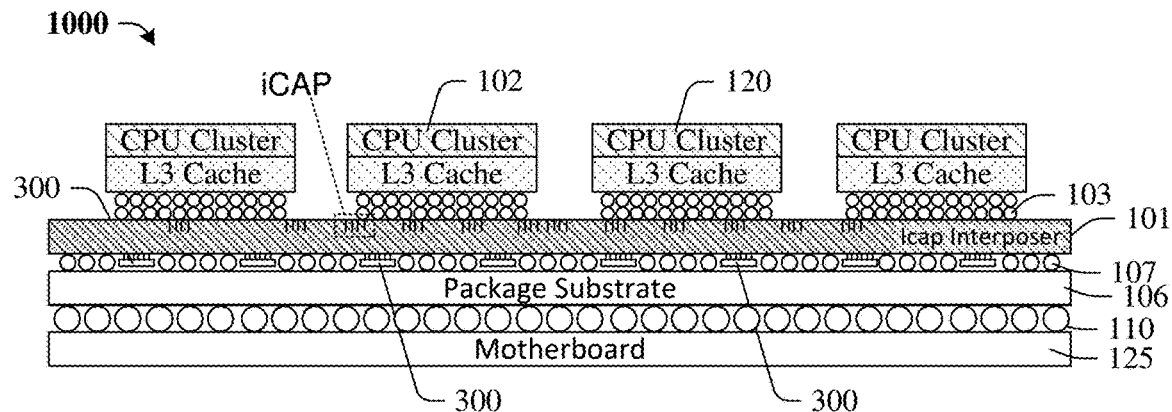
FIG. 10A illustrates a cross sectional view of a semiconductor structure in accordance with some embodiments of the present disclosure.
Figure 10B:
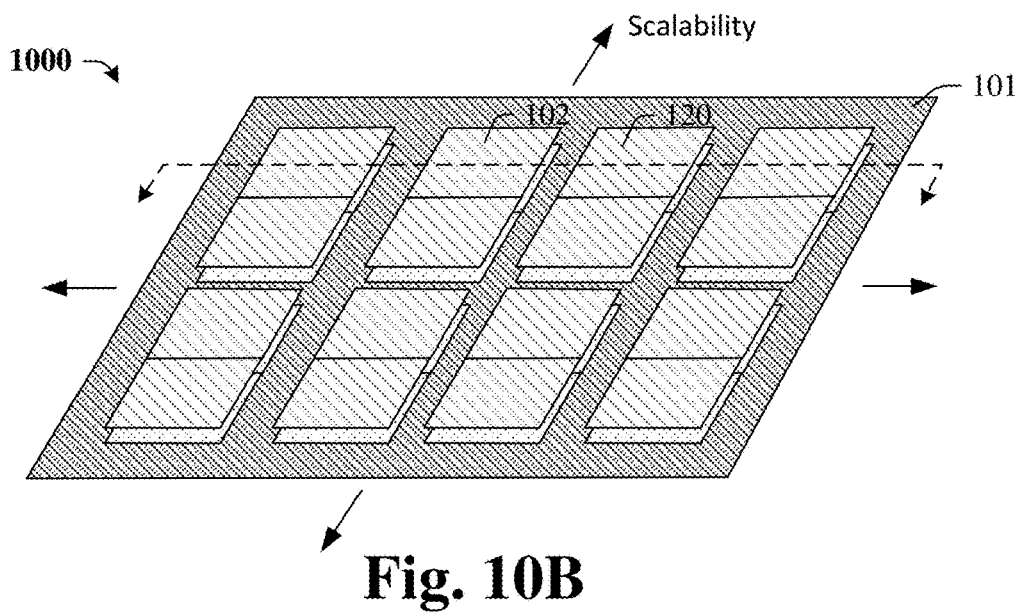
FIG. 10B illustrates a top view of the semiconductor structure of FIG. 10A in accordance with some embodiments of the present disclosure.

FIG. 10A illustrates another embodiment 1000 where one or more in-package voltage regulator (PVR) chips 300 are arranged between an upper surface of the second substrate and a lower surface of the first substrate, and between sidewalls of neighboring solder bumps. Each PVR chip 300 can be coupled to conductive pads on the lower surface of the first substrate 101, and trench capacitors integrated in the upper surface of the first substrate 101 can act as decoupling capacitors for the PVR chip 300. FIG. 10B illustrates a perspective top view of FIG. 10A's embodiment.

In some embodiments, the first die 102 includes a CMOS chiplet that includes four ARM® Cortex®-A72 cores, and which is stacked over a memory chiplet, such as an L3 cache. The second die 120 is also a CMOS chiplet that includes four ARM® Cortex®-A72 cores, and which is stacked over a memory chiplet, such as an L3 cache. Similar to FIG. 9's implementation, FIG. 10A also illustrates a decoupling capacitor 902 disposed on an upper surface of the first substrate 101. PVR chips 300 are disposed between the first substrate 101 and second substrate 106, and are laterally surrounded by the second conductive bumps 107.

Figure 11:
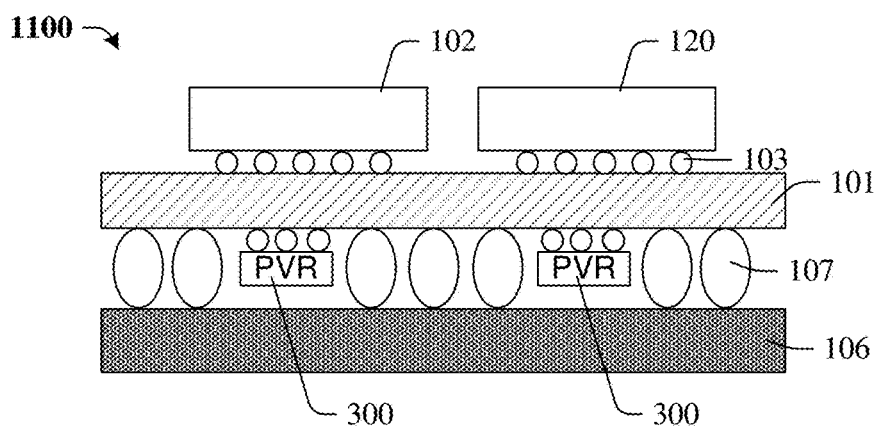
FIG. 11 illustrates a cross sectional view of a semiconductor structure in accordance with some embodiments of the present disclosure.

FIG. 11 illustrates another embodiment 1100 where one or more in-Package voltage regulators (PVR) chips 300 are arranged between a lower surface of the first substrate 101 and an upper surface of a second substrate 106, and between sidewalls of neighboring second conductive bumps 107. Each PVR chip 300 can be coupled to microbumps on the lower surface of the first substrate 101. Trench capacitors (not shown) can optionally be integrated in the upper surface of the first substrate 101 and can act as decoupling capacitors for the PVR chips 300.

Figure 12:
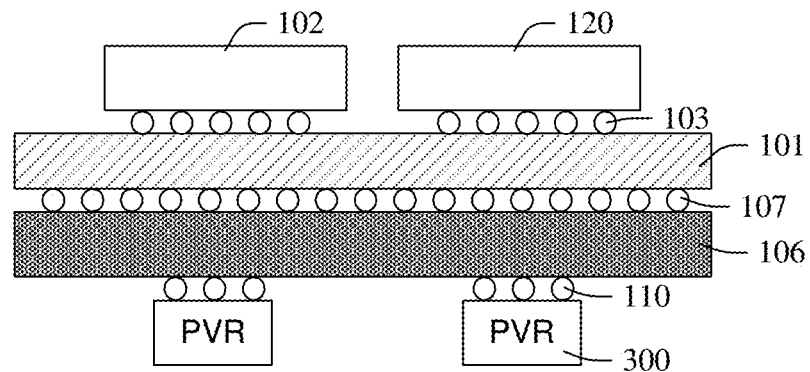
FIG. 12 illustrates a cross sectional view of a semiconductor structure in accordance with some embodiments of the present disclosure.

FIG. 12 illustrates another embodiment 1200 where one or more in-Package voltage regulators (PVR) chips 300 are arranged between below a lower surface of a second substrate 106 and are coupled to the second substrate 106 by one or more solder balls, microbumps, or conductive pads. Trench capacitors (not shown) can optionally be integrated in the upper surface of the first substrate 101 and can act as decoupling capacitors for the PVR chip 300.

Figure 13:
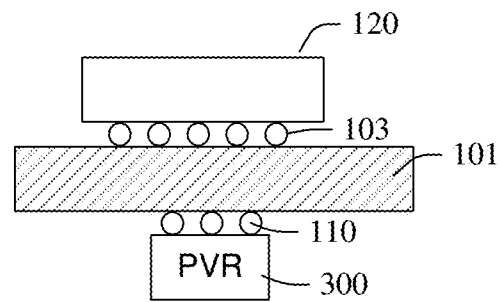
FIG. 13 illustrates a cross sectional view of a semiconductor structure in accordance with some embodiments of the present disclosure.

FIG. 13 illustrates another embodiment 1300 where one or more in-Package voltage regulators (PVR) chips 300 are arranged below a lower surface of the first substrate 101 and are coupled to the first die and/or or second die 120 by one or more solder balls, microbumps, or conductive pads. Trench capacitors (not shown) can optionally be integrated in the upper surface of the first substrate and can act as decoupling capacitors for the PVR chip 300.

Some embodiments relate to a semiconductor structure. The structure includes a first substrate including a first surface and a second surface opposite to the first surface. A first die is disposed over the second surface of the first substrate. A second die is disposed over the second surface of the first substrate and is adjacent to the first die. A plurality of first conductive bumps are disposed between the first substrate and the first die and between the first substrate and the second die. A second substrate is disposed below the first surface of the first substrate. A plurality of second conductive bumps is disposed between the first substrate and the second substrate. An in-package voltage regulator (PVR) chip is disposed over the second substrate. A molding material is disposed over the first substrate and surrounds the first die, the second die, the plurality of first conductive bumps, the plurality of second conductive bumps, and the PVR chip.

Other embodiments relate to a semiconductor structure. The semiconductor structure includes a first substrate including a first surface and a second surface opposite to the first surface. A first die is disposed over the second surface of the first substrate. A second die is disposed over the second surface of the first substrate and is adjacent to the first die. A plurality of first conductive bumps are disposed between the first substrate and the first die and between the first substrate and the second die. A second substrate is disposed below the first surface of the first substrate. A plurality of second conductive bumps is disposed between the first substrate and the second substrate. An in-package voltage regulator (PVR) chip, which includes an inductor disposed over a semiconductor substrate, is arranged between the first substrate and the second substrate and is laterally surrounded by the plurality of second conductive bumps.

Still other embodiments relate a semiconductor structure. The structure includes a first substrate including a first surface and a second surface opposite to the first surface. A first die is disposed over the second surface of the first substrate. A second die is disposed over the second surface of the first substrate and is adjacent to the first die. A plurality of first conductive bumps is disposed between the first substrate and the first die and between the first substrate and the second die. A second substrate is disposed below the first surface of the first substrate. An in-package voltage regulator (PVR) chip, which includes a buck-converter, is disposed over the second substrate, and is laterally spaced apart from a sidewall of the first substrate. A plurality of second conductive bumps is disposed between the first substrate and the second substrate and between the PVR chip and the second substrate. A molding material is disposed over the second substrate and surrounds the first die, the second die, the plurality of first conductive bumps, the plurality of second conductive bumps, and the PVR chip.

What is claimed is:

1. A semiconductor structure, comprising:
    a first substrate including a first surface and a second surface opposite to the first surface;
    a first die disposed over the second surface of the first substrate;
    a second die disposed over the second surface of the first substrate and adjacent to the first die;
    a plurality of first conductive bumps disposed between the first substrate and the first die and between the first substrate and the second die;
    a second substrate disposed below the first surface of the first substrate;
    a plurality of second conductive bumps disposed between the first substrate and the second substrate;
    an in-package voltage regulator (PVR) chip disposed over the second substrate;
    a molding material disposed over the first substrate and surrounding the first die, the second die, the plurality of first conductive bumps, the plurality of second conductive bumps, and the PVR chip; and
    an integrated passive die (IPD) chip comprising a capacitive device disposed in one or more trenches in a semiconductor substrate of the IPD chip, the semiconductor substrate of the IPD chip being arranged between the first substrate and the second substrate and being laterally surrounded by the plurality of second conductive bumps.

2. The semiconductor structure of claim 1, wherein the PVR chip is arranged laterally adjacent to the first substrate, and is connected to the second substrate through some of the plurality of second conductive bumps.

3. The semiconductor structure of claim 2, wherein the molding material directly contacts sidewalls of the PVR chip and is disposed between and contacts nearest neighboring sidewalls of the PVR chip and the first substrate.

4. The semiconductor structure of claim 2, further comprising:
    a thermal insulating material (TIM) disposed over and contacting an upper surface of the first die, disposed over and contacting an upper surface of the second die, and disposed over and contacting an upper surface of the PVR chip.

5. The semiconductor structure of claim 1, wherein the PVR chip is arranged between the first substrate and the second substrate, and is laterally surrounded by the plurality of second conductive bumps.

6. The semiconductor structure of claim 1, further comprising:
    a plurality of third conductive bumps disposed below the second substrate.

7. The semiconductor structure of claim 6, wherein the PVR chip is arranged under the second substrate, and is laterally surrounded by the plurality of third conductive bumps.

8. The semiconductor structure of claim 1, wherein the PVR chip is arranged over first substrate.

9. The semiconductor structure of claim 1, wherein the first die includes a first HPC processor, the second die includes a second HPC processor, the PVR chip provides power to the first HPC processor and the second HPC processor through the first conductive bumps, the first substrate, and the second conductive bumps, and wherein the IPD chip is placed directly beneath the first HPC processor of the first die.

10. The semiconductor structure of claim 1, wherein the first substrate is an interposer substrate devoid of active semiconductor devices, and wherein the interposer substrate includes a decoupling capacitor structure disposed in a series of trenches in a surface of the interposer substrate.

11. The semiconductor structure of claim 1:
    wherein the first substrate is a first interposer substrate devoid of active semiconductor devices; and
    wherein the second substrate is a second interposer substrate devoid of active semiconductor devices.

12. A semiconductor structure, comprising:
    a first substrate including a first surface and a second surface opposite to the first surface;
    a first die disposed over the second surface of the first substrate;
    a second die disposed over the second surface of the first substrate and adjacent to the first die;

a plurality of first conductive bumps disposed between the first substrate and the first die and between the first substrate and the second die;
a second substrate disposed below the first surface of the first substrate;
a plurality of second conductive bumps disposed between the first substrate and the second substrate; and
an in-package voltage regulator (PVR) chip, the PVR chip including an inductor disposed over a semiconductor substrate, and the PVR chip being arranged between the first substrate and the second substrate and being laterally surrounded by the plurality of second conductive bumps.

13. The semiconductor structure of claim 12, further comprising:
a molding material disposed over the first substrate and surrounding the first die, surrounding the second die, surrounding the plurality of first conductive bumps, surrounding the plurality of second conductive bumps, and surrounding the PVR chip.

14. The semiconductor structure of claim 12, further comprising:
a first underfill material disposed over the first substrate and surrounding the plurality of first conductive bumps; and
a second underfill material disposed over the second substrate and surrounding the plurality of second conductive bumps and the PVR chip.

15. A semiconductor structure, comprising:
a first substrate including a first surface and a second surface opposite to the first surface;
a first die disposed over the second surface of the first substrate;
a second die disposed over the second surface of the first substrate and adjacent to the first die;
a plurality of first conductive bumps disposed between the first substrate and the first die and between the first substrate and the second die;
a second substrate disposed below the first surface of the first substrate;
an in-package voltage regulator (PVR) chip comprising a buck-converter disposed over the second substrate, and laterally spaced apart from a sidewall of the first substrate;
a plurality of second conductive bumps disposed between the first substrate and the second substrate and between the PVR chip and the second substrate; and
a molding material disposed over the second substrate and surrounding the first die, the second die, the plurality of first conductive bumps, the plurality of second conductive bumps, and the PVR chip.

16. The semiconductor structure of claim 15, further comprising:
an integrated passive device (IPD) comprising a capacitive device disposed in one or more trenches in a semiconductor substrate of the IPD, the semiconductor substrate of the IPD being arranged between the first substrate and the second substrate and being laterally surrounded by the plurality of second conductive bumps.

17. The semiconductor structure of claim 15, wherein the first substrate is an interposer substrate devoid of active semiconductor devices, and wherein the interposer substrate includes a decoupling capacitor structure disposed in a series of trenches in a surface of the interposer substrate.

18. The semiconductor structure of claim 15, wherein the PVR chip comprises an inductor, and there is no active circuitry in the PVR chip directly above or directly below the inductor, and there is no active circuitry in the second substrate directly above or directly below the inductor.

19. The semiconductor structure of claim 12, further comprising decoupling capacitors disposed on the second substrate opposite the plurality of second conductive bumps, the decoupling capacitors coupled to the PVR chip.

20. The semiconductor structure of claim 1, wherein the IPD chip is spaced from the second substrate by the molding material.

* * * * *